United States Patent [19]
Nishigohri

[11] Patent Number: 5,874,331
[45] Date of Patent: Feb. 23, 1999

[54] METHOD OF MANUFACTURING CMOS SEMICONDUCTOR DEVICES BY FORMING A SALICIDE STRUCTURE

[75] Inventor: Masahito Nishigohri, Kawasaki, Japan

[73] Assignee: Kabushiki Kaisha Toshiba, Tokyo, Japan

[21] Appl. No.: 823,524

[22] Filed: Mar. 24, 1997

[30] Foreign Application Priority Data

Mar. 25, 1996 [JP] Japan ................................. 8-067621

[51] Int. Cl.$^6$ ............................................. H01L 21/8238
[52] U.S. Cl. ............................................. 438/231; 438/683
[58] Field of Search .................................. 438/230, 231, 438/232, 233, 655, 683

[56] References Cited

U.S. PATENT DOCUMENTS

| | | | |
|---|---|---|---|
| 4,876,213 | 10/1989 | Pfiester | 438/231 |
| 5,571,735 | 11/1996 | Mogami et al. | 438/231 |
| 5,668,024 | 9/1997 | Tsai et al. | 438/231 |
| 5,721,175 | 2/1998 | Kunishima et al. | 438/683 |

*Primary Examiner*—Chandra Chaudhari
*Attorney, Agent, or Firm*—Loeb & Loeb LLP

[57] ABSTRACT

A manufacturing method of simplifying the process and permitting SAC and the salicide technique by effecting the salicide process without removing a cap portion is provided. A manufacturing method of this invention includes a step of exposing part of the side surface of a gate electrode by effecting the anisotropic etching process in an over-etching fashion at the time of formation of side walls and converting a electrode material used as the gate electrode into silicide from the side surface of the exposed gate electrode.

13 Claims, 8 Drawing Sheets

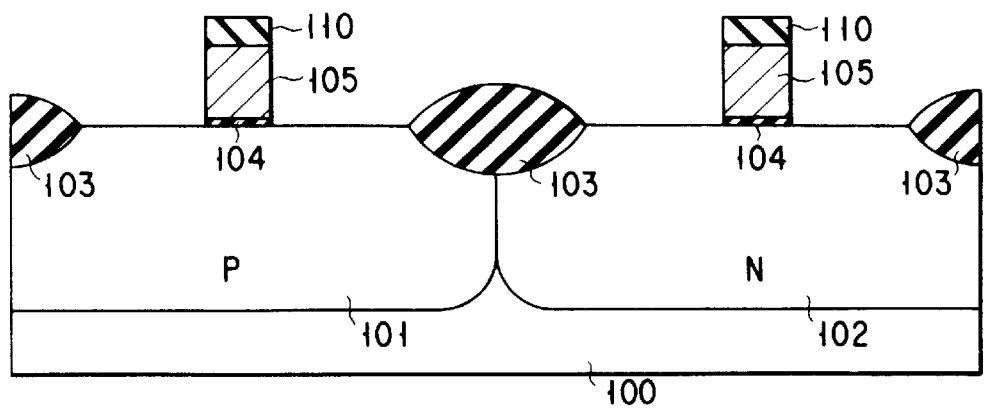
F I G. 1
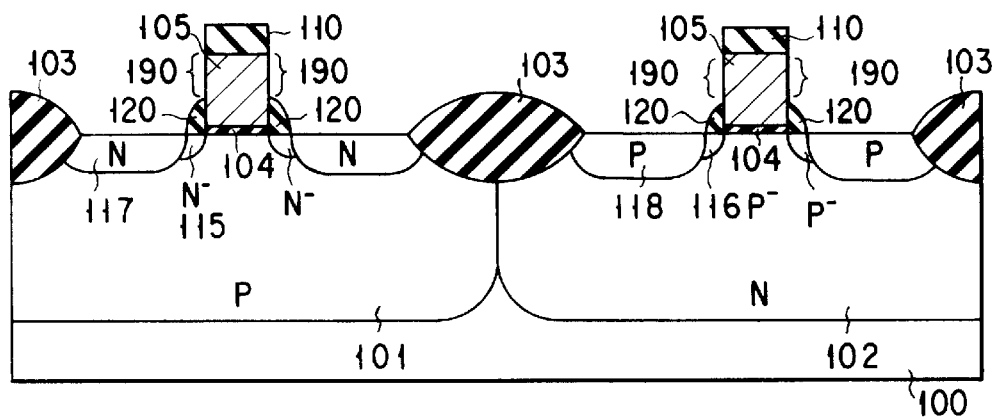
F I G. 2
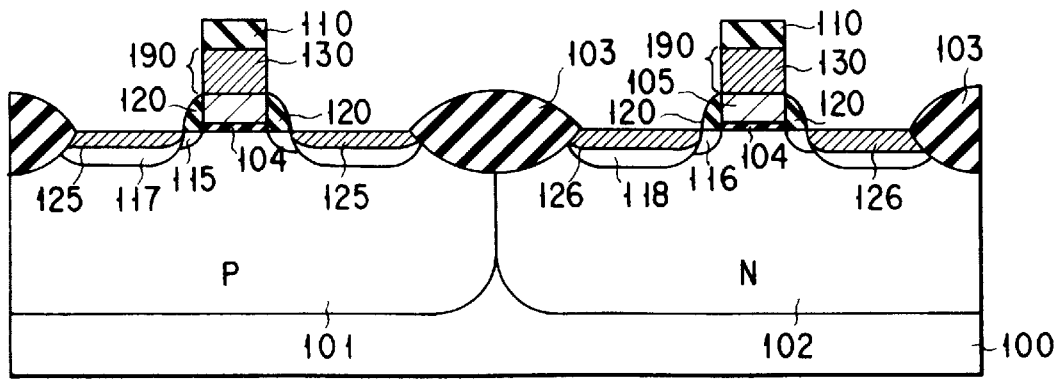
F I G. 3

METHOD OF MANUFACTURING CMOS SEMICONDUCTOR DEVICES BY FORMING A SALICIDE STRUCTURE

BACKGROUND OF THE INVENTION

This invention relates to a method of manufacturing CMOS semiconductor devices, and more particularly to a method of forming a salicide (self-aligned silicide) structure used for lowering the resistances of the diffusion layers and gate electrodes of semiconductor elements.

A method of forming a conventional semiconductor element using the salicide technology is explained in detail with reference to FIGS. 18 to 23 by taking a case of CMOS integrated circuit as an example. As shown in FIG. 18, a p-type well 2 and an n-type well 3 are selectively formed on a semiconductor substrate 1 by use of the ion-implantation technique or the like respectively in regions in which n-channel and p-channel MOS transistors are to be formed. Then, an element isolation insulating film 4 for isolating the element regions from each other is formed by use of an element isolation method such as a LOCOS method.

Next, as shown in FIG. 19, a gate insulating film 5 is formed on the semiconductor substrate and a polysilicon film 6 used as a gate material is formed on the gate insulating film. Then, an insulating film 7 such as a silicon dioxide film or silicon nitride film used as a cap material is formed on the polysilicon film. After this, a resist is coated and patterned.

A patterned resist is used as a mask to etch the cap material 7, the pattern of the patterned resist is transferred on the cap material 7 as shown in FIG. 20, and then the resist is removed.

Next, as shown in FIG. 21, the gate material 6 and gate insulating film 5 are selectively removed by an anisotropic etching process with the cap portions 7 used as a mask.

Then, as shown in FIG. 22, the cap portions 7 are removed. Shallow n-type and p-type diffusion layers 8, 9 of relatively low impurity concentration are respectively formed in the p-type well for the n-type transistor and the n-type well for the p-type transistor so as to form an LDD structure, if required. Then, an SiN film is formed over the entire surface and selectively etched by the anisotropic etching process to form side walls 10 of SiN film, and then ion-implantation is effected so that diffusion layers 11, 12 and formed in the p-type well 2 and n-type well 3, respectively, and at the same time, the gate portions 6 are ion-doped.

Next, as shown in FIG. 23, a refractory metal film is formed by a sputtering method or the like, and by effecting an adequate heat treatment, contact regions between the silicon surface portions and the refractory metal film, that is, the upper surface portions of the gate portions 6 and the surface portions of the semiconductor substrate are converted into silicide as indicated by a reference numeral 13. Then, a portion of the refractory metal film which is not used for silicide reaction, that is, an unreacted portion thereof is removed so as to form a semiconductor element utilizing the salicide technique.

Next, the reason why the pattern of the resist is transferred onto the cap material as described above is explained. As shown in FIG. 24, an insulating film 31 used as a gate insulating film is formed on a semiconductor substrate 30 and a polysilicon film 32 used as a gate electrode is formed on the insulating film.

After this, in order to form the gate electrode, the polysilicon film 32 and insulating film 31 are selectively etched by the anisotropic etching process with a patterned resist 33 used as a mask.

As the size of recent semiconductor elements is reduced, the distance W between the adjacent gate electrodes tends to be made shorter. When a region 20 of polysilicon film 32 and insulating film 31, between the adjacent gate electrodes is etched, an etchant gas cannot be sufficiently supplied to the region 20 if the distance W is short, and as a result, the etching process for the region will not smoothly proceed and it becomes necessary to prolong the etching time. In this case, the resist film thickness L must be made large accordingly. If the resist film thickness L is made large, the patterning precision of the resist pattern is lowered in the lithography process. Further, if the resist film thickness L is made large, it becomes more difficult to sufficiently supply the etchant gas to the region 20 in the etching process.

In order to solve the above problem, a cap material 35 formed of a thin insulating film is formed between the resist 33 and the polysilicon film 32 as shown in FIG. 25, and then the resist pattern is transferred to the cap material 35 by use of the anisotropic etching process (not shown). After this, the resist film 33 is removed and gate electrodes (not shown) are formed by the anisotropic etching process by using the cap portions 35 as a mask.

That is, by taking the above procedure, the cap portions 35 which are sufficiently thinner (M<N) than the resist 33 are used as a mask instead of the resist 33 so that the etchant gas can be sufficiently supplied to the region 20 between the gate electrodes without increasing the distance W between the gate electrodes. Therefore, in order to form a small-sized semiconductor element, the cap portions 35 are indispensable.

However, when both of the cap portions and the salicide technique are used and if the cap portions are formed on the polysilicon film which is used as the gate electrode, then the polysilicon film is not converted into silicide and the gate resistance becomes high, and therefore, the cap portions must be removed before formation of salicide (refer to FIG. 21 and FIG. 22).

Use of a self-aligned contact (SAC) is an effective technique for high integration density, but since the technique cannot be used if an insulating cap portion is not formed on the gate, it becomes impossible to simultaneously use the above technique and the salicide technique which is based on the condition that the cap portion is removed.

As described above, use of the cap portion is indispensable in order to form a small-sized semi-conductor element. However, in a case where the salicide technique is used at this time, the polysilicon film is not converted into silicide and the gate resistance becomes high if the cap portion is formed on the polysilicon film which is used as the gate electrode, and therefore, the cap portion must be removed before formation of salicide.

Further, since the self-aligned contact (SAC) cannot be used if an insulative cap portion is not formed on the gate electrode, it becomes impossible to simultaneously use the self-aligned contact and the salicide technique which is based on the condition that the cap portion is removed.

BRIEF SUMMARY OF THE INVENTION

An object of this invention is to provide a manufacturing method for semiconductor devices which makes it possible to simplify the manufacturing process and use SAC by forming salicide without removing a cap portion.

In order to attain the above object, a manufacturing method of this invention includes a step of exposing part of the side surfaces of gate electrodes by effecting the anisotropic etching process in an over-etching fashion at the time of formation of side walls and converting an electrode material into silicide from the exposed side surface of the gate electrode.

In this invention, since conversion into silicide is effected from the side surface of the gate electrode, it is not necessary to remove a cap portion even if the cap portion is formed to cover the upper surface of the gate and it becomes possible to simultaneously use the cap portion and SAC.

According to the present invention, there is provided a method of manufacturing a semiconductor device by use of the salicide technique, comprising the steps of: forming a first insulating film used as a gate insulating film on a semiconductor substrate of one conductivity type; forming an electrode material used as a gate electrode on the first insulating film; forming a second insulating film used as a cap portion on the electrode material; coating a resist on the second insulating film and then subjecting the resist to the patterning process for formation of the gate electrode by use of the lithography technology; selectively etching the second insulating film by the anisotropic etching process with the patterned resist used as a mask to transfer the pattern of the resist onto the second insulating film; removing the resist and then selectively etching the electrode material and the first insulating film by the anisotropic etching process by using the second insulating film on which the pattern is transferred as a mask to form the gate electrode; doping impurity of opposite conductivity type into the semiconductor substrate of one conductivity type by using the second insulating film which lies on the gate electrode as a mask to form first diffusion layers used as a source and drain; forming a third insulating film on the upper surface of the semiconductor substrate of one conductivity type, the side surface of the gate electrode and the upper surface of the second insulating film; forming side walls lower than the gate electrode on both side surfaces of the gate electrode by selectively etching the third insulating film by the anisotropic etching process until the side surface of the gate electrode is exposed; doping impurity of opposite conductivity type into the electrode material via the second insulating film without using a mask and doping impurity into the semiconductor substrate of one conductivity type to form a second diffusion layer in a self-aligned manner; forming a refractory metal film on at least the upper surface of the semiconductor substrate of one conductivity type and the exposed side surface of the gate electrode and effecting the heat treatment to convert the surface portion of the semiconductor substrate of one conductivity type into silicide, and at the same time, converting the electrode material into silicide from the exposed portion of the both side surfaces of the gate electrode; and removing an unreacted refractory metal portion of the refractory metal film. The step of converting the electrode material and the semiconductor substrate of one conductivity type into silicide may include a step of converting the electrode material into silicide only from an exposed portion of one side surface of the gate electrode. The gate electrode may be etched and formed into a trapezoidal form when the gate electrode is formed by the anisotropic etching process. The height of the side wall lower than the gate electrode may be not less than 300 nm and the width thereof may be not less than 50 nm.

According to the present invention, there is further provided a method of manufacturing a semiconductor device having self-aligned contacts, comprising the steps of: forming a first insulating film used as a gate insulating film on a semiconductor substrate of one conductivity type; forming an electrode material used as a gate electrode on the first insulating film; forming a second insulating film used as a cap portion on the electrode material; coating a resist on the second insulating film and then subjecting the resist to the patterning process for formation of the gate electrode by use of the lithography technology; selectively etching the second insulating film by the anisotropic etching process with the patterned resist used as a mask to transfer the pattern of the resist formed for formation of the gate electrode onto the second insulating film; removing the resist and then selectively etching and removing the electrode material and the first insulating film by the anisotropic etching process with the second insulating film used as a mask to form two gate electrodes on which the second insulating film lies; doping impurity of opposite conductivity type into the semiconductor substrate of one conductivity type by using the second insulating film which lies on the two gate electrodes as a mask to form first diffusion layers used as a source and drain; forming a third insulating film on the surface of the semiconductor substrate of one conductivity type, the side surfaces of the two gate electrodes and the upper surface of the second insulating film; coating a resist on the third insulating film until the third insulating film formed on the two gate electrodes is buried and then leaving the resist only part of the upper portions of the two gate electrodes and a portion between the two gate electrodes by use of the lithography technology; etching the third insulating film by the anisotropic etching process with the resist used as a mask to form first side walls formed of the third insulating film only on outer side portions of the two gate electrodes; removing the resist, etching the first side walls by the anisotropic etching process without using a mask to make the first side wall lower than the gate electrode and expose part of the side surfaces of the outside portions of the two gate electrodes, and at the same time, forming second side walls higher than the gate electrode on the inner sides of the two gate electrodes by etching the third insulating film formed between the two gate electrodes to form the side walls with different heights on the outer sides and inner sides of the two gate electrodes; forming second diffusion layers used as a source and drain by doping impurity of opposite conductivity type into the semiconductor substrate of one conductivity type by using the side walls formed on the outer and inner sides of the two gate electrodes as a mask; and forming a refractory metal film on at least the surface of the semiconductor substrate of one conductivity type and the exposed portion of the electrode material on the outer side surfaces of the two gate electrodes and effecting the heat treatment to convert the surface portion of the semiconductor substrate of one conductivity type into silicide, and at the same time, converting the electrode material into silicide from the exposed portion of the electrode material on the outer side surfaces of the two gate electrodes. Not only the third insulating film but also part of the second insulating film which lies outside the gate electrode may be etched when the anisotropic etching process is effected in the step of forming the first side walls. The height of the first side wall may be not less than 300 nm and the width thereof may be not less than 50 nm. The gate electrode formed in the step of forming the two gate electrodes on which the second insulating film lies may be formed in a trapezoidal shape.

According to the present invention, there is still further provided a method of manufacturing a semiconductor device having self-aligned contacts, comprising the steps of: forming a first insulating film used as a gate insulating film on a semiconductor substrate of one conductivity type; forming an electrode material used as a gate electrode on the first insulating film; forming a second insulating film used as a cap portion on the electrode material; coating a resist on the second insulating film and then subjecting the resist to the patterning process for formation of the gate electrode by use of the lithography technology; selectively etching the second insulating film by the anisotropic etching process with the patterned resist used as a mask to transfer the pattern of the resist formed for formation of the gate electrode onto the second insulating film; removing the resist and then selectively etching and removing the electrode material and the first insulating film by the anisotropic etching process with the second insulating film used as a mask to form two gate electrodes on which the second insulating film lies; doping impurity of opposite conductivity type into the semiconductor substrate of one conductivity type by using the second insulating film which lies on the two gate electrodes as a mask to form first diffusion layers used as a source and drain; forming a third insulating film on the surface of the semiconductor substrate of one conductivity type, the side surfaces of the two gate electrodes and the upper surface of the second insulating film; etching the third insulating film by the anisotropic etching process without using a mask to form first side walls lower than the gate electrode on both side surfaces of the two gate electrodes; doping impurity of opposite conductivity type into the electrode material via the second insulating film by using the first side walls formed on the inner and outer sides of the two gate electrodes as a mask, and at the same time, doping impurity of opposite conductivity type into the semiconductor substrate of one conductivity type to form second diffusion layers used as a source and drain in a self-alignment manner; forming a refractory metal film on at least the surface of the semiconductor substrate of one conductivity type and the exposed portion of the electrode material on the both side surfaces of the two gate electrodes and effecting the heat treatment to convert the surface portion of the semiconductor substrate of one conductivity type into silicide, and at the same time, converting the electrode material into silicide from the exposed portion of the electrode material on the both side surfaces of the two gate electrodes; removing an unreacted portion of the refractory metal film and forming a fourth insulating film on the upper surface of the semiconductor substrate of one conductivity type, the side surfaces of the gate electrodes and the first side walls, and the upper surface of the second insulating film; forming a fifth insulating film on the fourth insulating film until the two gate electrodes are completely buried; coating a resist on the fifth insulating film and removing part of the resist formed on the two gate electrodes and formed between the two gate electrodes by use of the lithography technology; etching and removing the fifth insulating film by the anisotropic etching process with the remaining resist used as a mask; and etching the fourth insulating film by the anisotropic etching process with the resist used as a mask to form second side walls higher than the gate electrode on the inner sides of the two gate electrodes.

The resist removed by the lithography technology in the step of removing the resist coated until the fourth insulating film on the second insulating film is buried may be only a resist lying between the two gate electrodes. The height of the first side wall may be not less than 300 nm and the width thereof may be not less than 50 nm. The gate electrode formed in the step of forming the two gate electrodes on which the second insulating film lies may be formed in a trapezoidal shape. The resist may be removed and the fifth insulating film may used as a mask when the second side walls are formed by the anisotropic etching process in the step of forming the side walls higher than the gate electrode on the inner sides of the two gate electrodes.

Additional objects advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross sectional view of a semiconductor structure at a step of a manufacturing method of a semiconductor device, according to a first embodiment of the present invention;

FIG. 2 is a cross sectional view of a semiconductor structure at a step of the manufacturing method of the semiconductor device, according to the first embodiment of the present invention;

FIG. 3 is a cross sectional view of a semiconductor structure at a step of the manufacturing method of the semiconductor device, according to the first embodiment of the present invention;

DETAILED DESCRIPTION OF THE INVENTION

Figure 4:
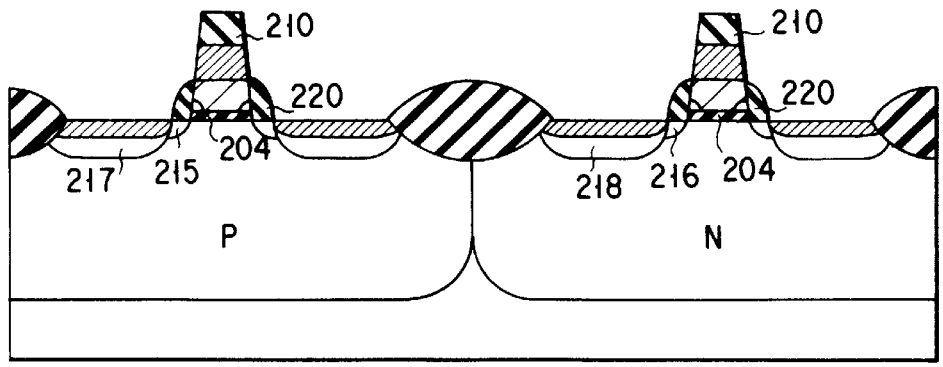
FIG. 4 is a cross sectional view of a semiconductor structure at a step of a manufacturing method of a semiconductor device, according to a second embodiment of the present invention.

There will now be described an embodiment of this invention with reference to the accompanying drawings. As shown in FIG. 1, a P-type well 101 and an N-type well 102 are formed on a semiconductor substrate 100 respectively in a region in which an N-channel MOS transistor is formed and a region in which a P-channel MOS transistor is formed by use of the ion-implantation technique, and an insulating film 103 for element isolation is formed by use of the normal LOCOS method. A gate insulating film 104 of silicon dioxide with a thickness of approx. 5 to 10 nm is formed on the upper surfaces of the P-type and N-type wells 101, 102 by thermal oxidation, an electrode material 105 of polysilicon with a thickness of approx. 300 to 400 nm is formed on the gate insulating film 104 by the CVD method, and a cap material 110 of silicon nitride with a thickness of approx. 100 nm is formed on the electrode material 105 by the CVD method. Then, gate electrodes are formed on the P-type well 101 and N-type well 102 by patterning the gate insulating film 104, electrode material 105 and cap material 110 by use of the normal photolithography technology. In this step, the cap material 110 is not removed.

Next, as shown in FIG. 2, phosphorus is ion-implanted into the P-type well 101 with the cap portions 110 and the element isolation insulating film 103 used as a mask and with the N-type well 102 covered with a resist mask (not shown) in a condition that the ion-implantation energy is 20 keV and the dose amount is $1.0 \times 10^{13}$ cm$^{-2}$ (in a case where arsenic is used as the doped impurity, the ion-implantation energy is 40 keV and the dose amount is $1.0 \times 10^{13}$ cm$^{-2}$) so as to form shallow diffusion layers 115 of low impurity concentration. Then, a mask is formed to cover the P-type well 101 and boron is ion-implanted into the N-type well 101 in a condition that the ion-implantation energy is 35 keV and the dose amount is $1.0 \times 10^{13}$ cm$^{-2}$ so as to form shallow diffusion layers 116 of low impurity concentration. After this, an insulating film of silicon nitride is formed on the entire surface of the element by use of the CVD method and then the silicon nitride film is selectively etched by use of the anisotropic etching method (RIE method) to form side walls 120 of silicon nitride. At this time, the etching process for the silicon nitride film is effected until portions 190 of the side surfaces of the electrode portions 105 are exposed. That is, the etching process is effected in an over-etching fashion. After this, diffusion layers 117 and 118 are formed by using the side walls 120 and isolation insulating film 103 as a mask and sequentially ion-implanting arsenic into the P-type well 101 (in a condition that the ion-implantation energy is 35 keV and the dose amount is $1.0 \times 10^{15}$ cm$^{-2}$) and BF$_2$ into the N-type well 102 (in a condition that the ion-implantation energy is 50 keV and the dose amount is $1.0 \times 10^{15}$ cm$^{-2}$).

Next, a refractory metal film (for example, titanium film) is formed on the entire surface of the element by the sputtering method and the heat treatment is effected to react refractory metal with silicon on the surfaces of the P- and N-type wells so as to form silicide portions 125 and 126 as shown in FIG. 3, and at the same time, react refractory metal with the electrode material portions 105 from the portions 190 of the exposed surfaces thereof so as to form silicide portions 130 on parts of the electrode material portions 105. Thus, a semiconductor device using the salicide (self-aligned silicide) technique is manufactured.

In this embodiment, the silicide reaction proceeds from the side surface portion of the electrode material portion 105 towards the inner portion thereof. Therefore, it is considered that even part of the electrode material portion 105 which lies near the gate insulating film 104 is converted into silicide and the refractory metal film gives bad influence to the gate insulating film 104 to cause a degradation in the element characteristic such as a lowering in the threshold voltage.

In order to solve the above problem, it is necessary to set the height of the side wall 120 to a certain amount of height (for example, 100 to 200 nm) when the side wall 120 is formed by the over-etching of silicon nitride.

Further, it is necessary to set the width of the side wall 120 to a width (for example, 50 to 100 nm) which is large enough to prevent the short-circuiting called the bridging between the gate electrode and the diffusion layers 117, 125, 118, 126 used as the source and drain regions.

Therefore, in the case of fine gate structure in which the film thickness of the electrode material portion 105 formed of polysilicon is approx. 300 to 400 nm and the width of the gate electrode is 400 nm or less, the area of the silicide portion is larger in this invention in which the silicide forming process is effected from both side surfaces of the electrode material portion 105 used as the gate electrode than in the conventional case in which the silicide forming process is effected from the upper surface of the electrode material portion 105 used as the gate electrode.

Thus, since the reaction efficiency is higher in this invention in which the silicide reaction proceeds from the side surface of the gate electrode than in the conventional case, time for the heat treatment for the silicide reaction can be reduced.

Further, in order to prevent the cap portion 110 from being etched when the side wall 120 is formed by the overetching, it is necessary to set a sufficiently large etching ratio for the cap portion 110 and the insulting film used as the side wall 120.

For thes reason, in a case where the same silicon nitride film is used for the cap portion 110 and the insulting film used as the side wall 120, it is necessary to form the cap portion 110 by the low pressure CVD method and form the insulting film used as the side wall 120 by the plasma CVD method, for example, so as to make the compositions of silicon nitride thereof different from each other.

Further, in this embodiment, the diffusion layers 117, 118 used as the source and drain are formed by selectively doping impurity into the P-type or N-type well 101, 102, and at the same time, impurity is doped into the electrode material portion 105 formed of polysilicon via the cap portion.

In this case, in order to dope a sufficiently large amount of impurity into the electrode material portion 105 of polysilicon, it is necessary to make the film thickness of the cap portion 110 as small as possible (for example, approx. 100 nm).

If the silicide forming process proceeds from the portion 190 of the side wall of the electrode material portion 105 to a depth of 100 to 150 nm, portions of silicide reaction from both side surfaces will be combined in the internal portion thereof in the case of fine gate structure. Therefore, like the conventional case, the upper portion of the electrode material portion 105 used as the gate electrode can be completely converted into silicide and the resistance can be lowered to an extent equal to or larger than in the case of conventional method.

Next, a second embodiment of this invention is explained with reference to FIG. 4. When the gate electrode is formed by the anisotropic etching method in the first embodiment, the etching condition such as the etchant gas component is changed so as to form the gate electrode in a trapezoidal form (forwardly tapered form) in this embodiment as shown in FIG. 4.

In this case, since the gate electrode is formed in a trapezoidal form, the side surface of the gate electrode is not perpendicular to the substrate and makes a certain angle with respect to the substrate. Therefore, it becomes easier to deposit refractory metal used for formation of silicide on the gate side surface and the area of the side surface is made larger. As a result, the silicide reaction can be made more efficient than in the first embodiment, time for the silicide reaction can be further reduced and the resistance of the gate electrode can be further lowered. The process effected after the silicide forming process is the same as that in the first embodiment. Refractory metal tends not to deposit on a side surface by a sputter method when the side surface is perpendicular. However, when, as in this embodiment, the side surface of the gate electrode is tapered refractory metal becomes easier to be deposited on the gate side surface by the sputter method. Thus, it is preferable for use of the sputter method to taper the gate side surface with respect to the substrate.

Figure 5:
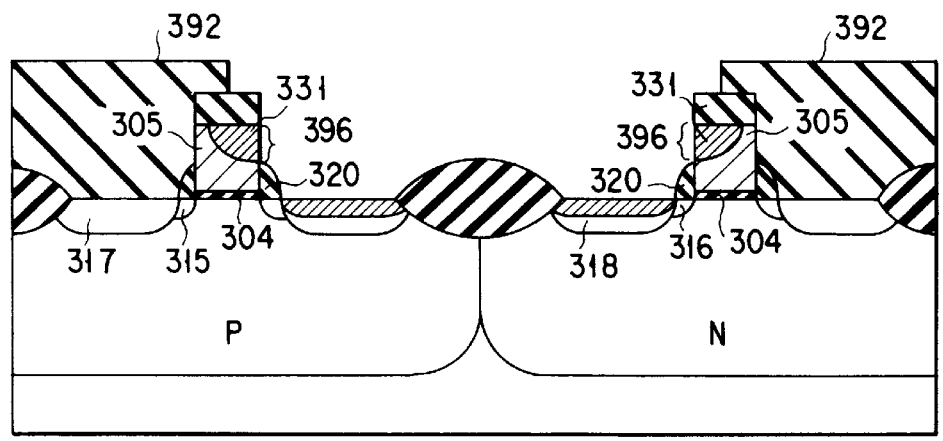
FIG. 5 is a cross sectional view of a semiconductor structure at a step of a manufacturing method of a semiconductor device, according to a third embodiment of the present invention.
Figure 6:
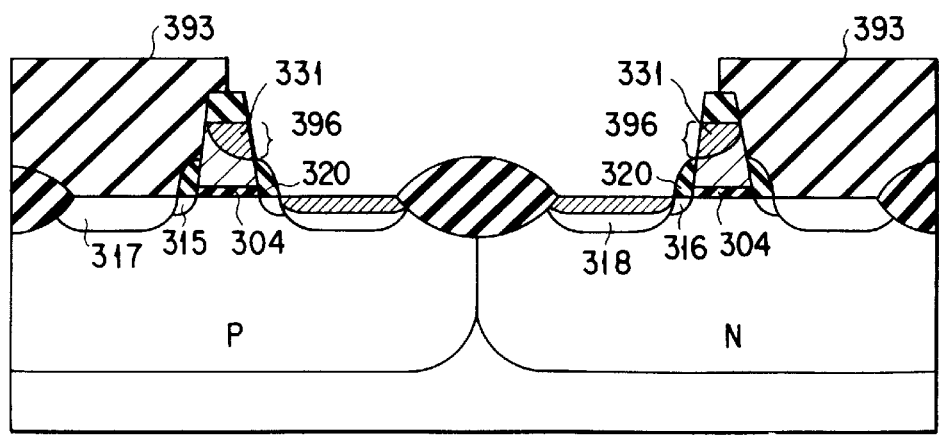
FIG. 6 is a cross sectional view of a semiconductor structure at a step of a manufacturing method of a semiconductor device, according to a fourth embodiment of the present invention.

Next, a third embodiment of this invention is explained with reference to FIGS. 5 and 6. As shown in FIGS. 5 and 6, like the first and second embodiments, in a case where the silicide forming process is effected from the side surface of an electrode material portion 305 used as the gate electrode, the silicide forming process can be effected only from an exposed portion 396 of the one-side surface of the electrode material portion 305 in some cases because of the presence of obstacles 392, 393.

In this case, since a portion 331 which is formed in a silicide form is formed only on one side of the electrode material portion 305, the resistance of the electrode material portion 305 becomes high, but an influence by an increase in the resistance of the whole portion of the electrode material portion 305 is small.

Figure 7:
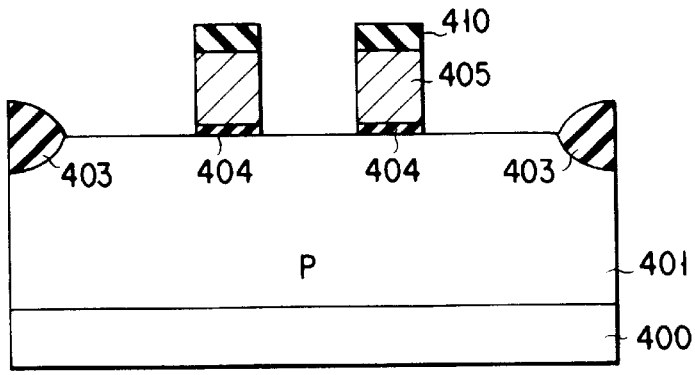
FIG. 7 is a cross sectional view of a semiconductor structure at a step of a manufacturing method of a semiconductor device, according to a fifth embodiment of the present invention.

Next, a fourth embodiment of this invention is explained with reference to FIGS. 7 to 13. As shown in FIG. 7, an element isolation insulating film 403 is formed on a P-type well 401 by the normal LOCOS method and then two gate electrodes having cap portions 410 formed thereon are formed by the same process as in the first embodiment.

Figure 8:
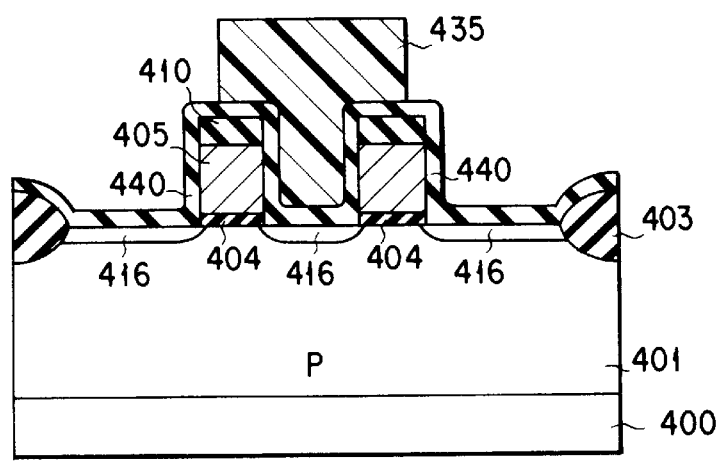
FIG. 8 is a cross sectional view of a semiconductor structure at a step of the manufacturing method of the semiconductor device, according to the fifth embodiment of the present invention.

Next, as shown in FIG. 8, diffusion layers 416 used as the source and drain are formed by ion-implanting impurity into the P-type well 401 in the state shown in FIG. 7 in a certain condition (for example, in a condition that the impurity to be ion-implanted is phosphorus, the ion-implantation energy is 20 keV and the dose amount is $1.0 \times 10^{13}$ cm$^{-2}$), and after an insulating film 440 formed of silicon nitride film is formed to a thickness of approx. 50 to 100 nm by the CVD method, a resist 435 is formed to completely bury the cap portions 410 and the resist 435 is subjected to the patterning process for formation of SAC by use of the lithography method.

Figure 9:
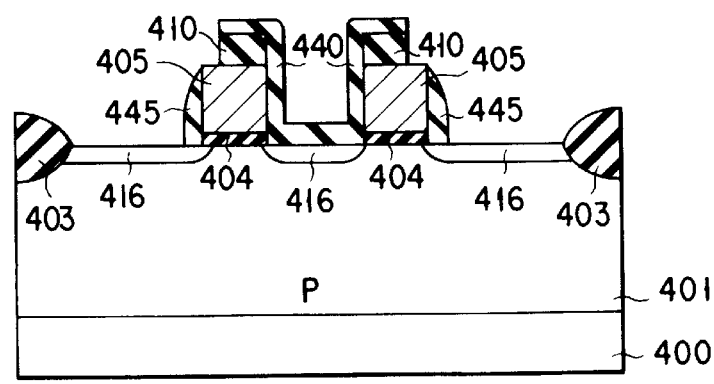
FIG. 9 is a cross sectional view of a semiconductor structure at a step of the manufacturing method of the semiconductor device, according to the fifth embodiment of the present invention.

Next, as shown in FIG. 9, the insulating film 440 is etched (first etching) by the anisotropic etching process with the patterned resist 435 used as a mask so as to form side walls 445 to substantially the same height as the gate electrode on the outer sides of the two gate electrodes and then the resist 435 is removed.

In the etching process for forming the above side walls, if the etching ratio for the cap portion 410 and the insulating film 440 cannot be set to a sufficiently large value, part of the cap portion 410 formed on the gate electrode is also etched as shown in FIG. 9.

If the patterned resist 435 (refer to FIG. 8) is not present above the cap portion 410, the entire portion of the cap portion 410 which lies on the gate electrode is etched.

Therefore, if the etching ratio for the cap portion 410 and the insulating film 440 cannot be set sufficiently large, the patterned resist 435 is required to be present also on the cap portions 410 which lie on the two gate electrodes. That is, the patterned resist 435 is formed in the shape of "T".

On the other hand, if the etching ratio for the cap portion 410 and the insulating film 440 can be set to a sufficiently large value, the patterned resist 435 is not required to be present on the cap portions 410 which lie on the two gate electrodes.

Figure 10:
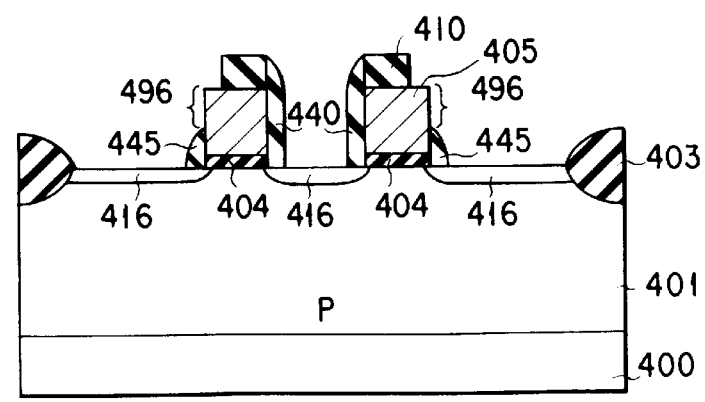
FIG. 10 is a cross sectional view of a semiconductor structure at a step of the manufacturing method of the semiconductor device, according to the fifth embodiment of the present invention.

Next, as shown in FIG. 10, the insulating film 440 is etched (second etching) by the anisotropic etching process without using a mask so as to form side walls 440 which are higher than the gate electrode on the inner sides of the two gate electrodes, and at the same time, the side walls 445 formed on the outer sides of the two gate electrodes are reduced in size to expose the side surfaces of the electrode material portions 405.

The length of the etching time is adjusted so that the dimensions of the side wall 445 which depend on the total length of time for the first and second etching steps may be set to adequate values (for example, the height is set to 100 to 200 nm, the width is set to 50 to 100 nm) for the reason described before.

Figure 11:
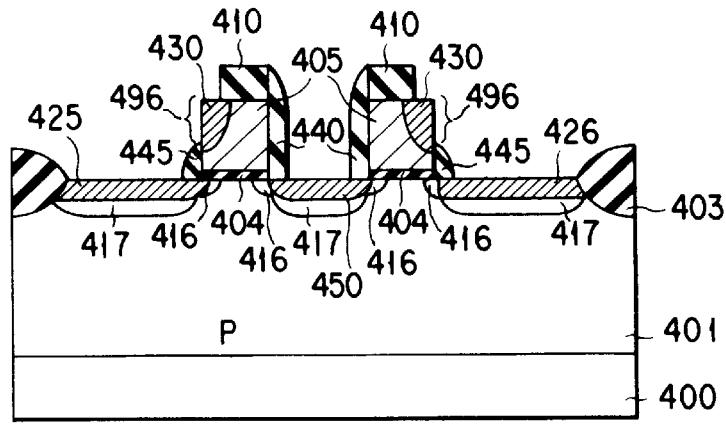
FIG. 11 is a cross sectional view of a semiconductor structure at a step of the manufacturing method of the semiconductor device, according to the fifth embodiment of the present invention.

Next, as shown in FIG. 11, diffusion layers 417 are formed by ion-implanting impurity (for example, in a condition that the impurity to be ion-implanted is arsenic, the ion-implantation energy is 35 keV and the dose amount is $1.0 \times 10^{15}$ cm$^{-2}$), then a refractory metal film (for example, a titanium film) is formed on the entire surface of the element, and the heat treatment is effected to react silicon with refractory metal so as to convert the surface portions of the diffusion layers used as the source and drain into silicide, and at the same time, cause the silicide forming process to proceed from exposed portions 496 of the electrode material portions 405.

Figure 12:
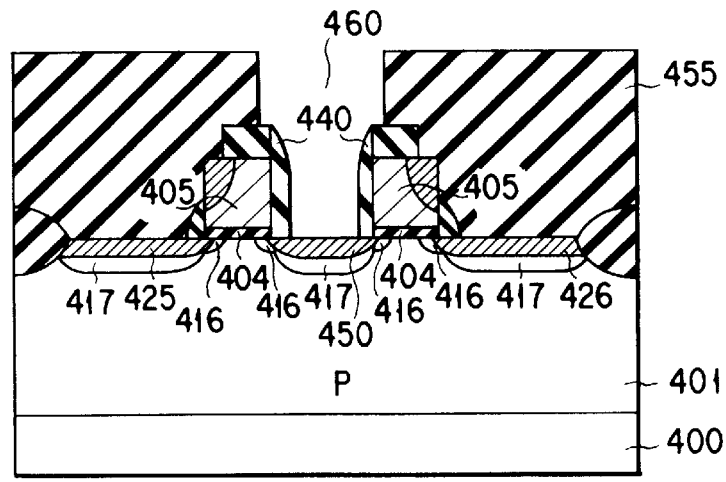
FIG. 12 is a cross sectional view of a semiconductor structure at a step of the manufacturing method of the semiconductor device, according to the fifth embodiment of the present invention.

After this, as shown in FIG. 12, an interlayered insulating film 455 is formed by the CVD method in the state shown in FIG. 11 and a contact hole 460 used for formation of SAC (self-aligned contact) is formed in the interlayered insulating film 455.

Figure 13:
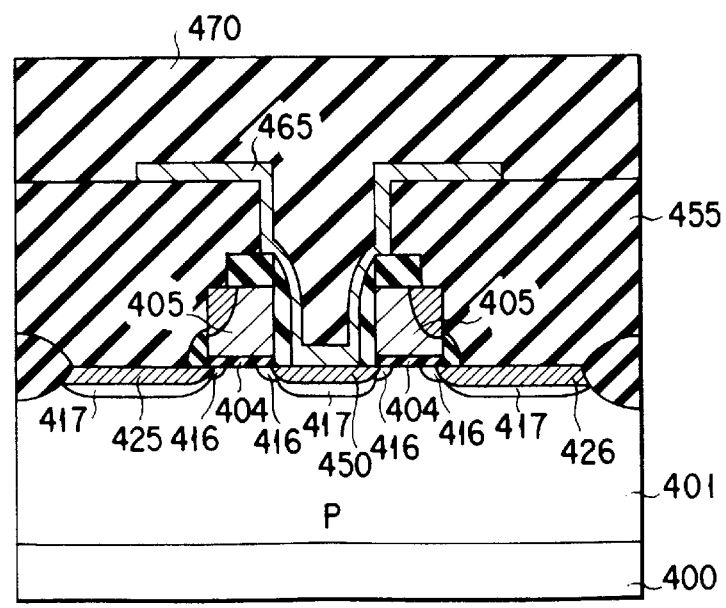
FIG. 13 is a cross sectional view of a semiconductor structure at a step of the manufacturing method of the semiconductor device, according to the fifth embodiment of the present invention.

After this, as shown in FIG. 13, a wiring material 465 is formed in the contact hole 460 and then a protection film 470 is formed to manufacture a semiconductor device using SAC.

Like the third embodiment, in this embodiment, since the silicide forming process proceeds only from one side surface of the electrode material portion 405, the resistance of the electrode material portion becomes high, but an influence by an increase in the resistance of the whole portion of the electrode material portion is small.

Further, since the cap portion 410 formed of an insulating film is formed on the gate electrode, the electrode material portion 405 used as the gate electrode can be prevented from being exposed directly to the contact hole 460. Therefore, even if the position of the gate electrode overlaps with part of the contact hole 460, the electrode material portion 405 and the wiring material 465 will not be shortcircuited with each other.

Since this embodiment is constructed as described above, it becomes possible to simultaneously use the salicide technique and SAC which is based on the condition that the cap portion is used.

Figure 14:
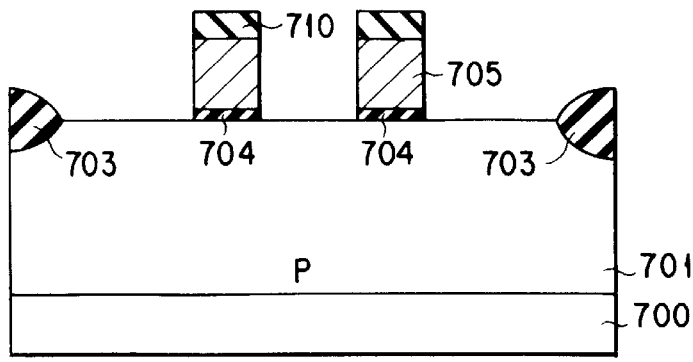
FIG. 14 is a cross sectional view of a semiconductor structure at a step of a manufacturing method of a semiconductor device, according to a sixth embodiment of the present invention.

Next, a fifth embodiment of this invention is explained with reference to FIGS. 14 to 17. As shown in FIG. 14, two gate electrodes having cap portions 710 formed thereon are formed by the same process as indicated by FIG. 7 in the fourth embodiment.

Figure 15:
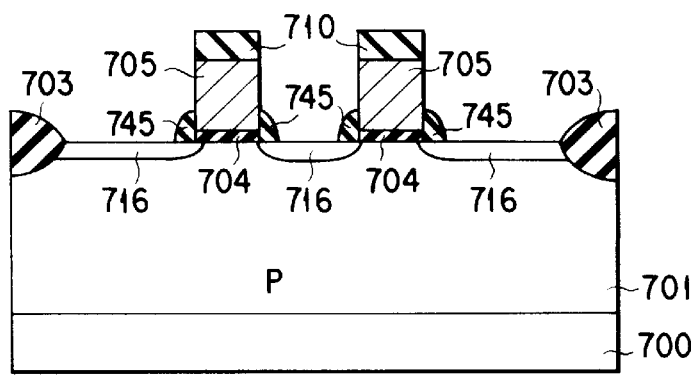
FIG. 15 is a cross sectional view of a semiconductor structure at a step of a manufacturing method of a semiconductor device, according to a sixth embodiment of the present invention.

In the state shown in FIG. 14, diffusion layers 716 used as the source and drain are formed, as shown in FIG. 15, by ion-implanting impurity into a P-type well 701 with the cap portions 710 and interlayered insulating film 703 used as a mask in a certain condition (for example, in a condition that the impurity to be ion-implanted is phosphorus, the ion-implantation energy is 20 keV and the dose amount is $1.0 \times 10^{13}$ cm$^{-2}$), then an insulating film 745 formed of silicon nitride is formed to a thickness of approx. 50 to 100 nm on the entire portion of the element by the CVD method and side walls 745 are formed by the anisotropic etching process without using a mask. At this time, the side surfaces of electrode material portions 705 are exposed by the over-etching.

Figure 16:
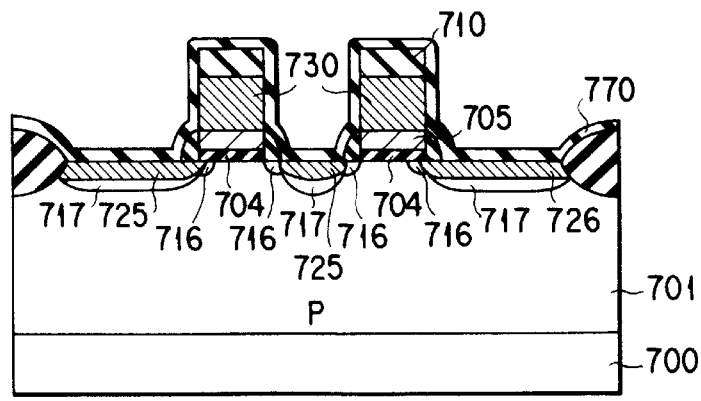
FIG. 16 is a cross sectional view of a semiconductor structure at a step of the manufacturing method of the semiconductor device, according to the sixth embodiment of the present invention.

Next, as shown in FIG. 16, diffusion layers 717 are formed by ion-implanting impurity (for example, in a condition that the impurity to be ion-implanted is arsenic, the ion-implantation energy is 35 keV and the dose amount is $1.0 \times 10^{15}$ cm$^{-2}$), then a refractory metal film (for example, a titanium film) is formed on the entire surface of the element, and the heat treatment is effected to react silicon with refractory metal so as to form silicide layers 725, 726 on the surface of the diffusion layers used as the source and drain, and at the same time, cause the silicide forming process to proceed from the side surfaces of the electrode material portions 705 so as to form silicide layers 730. After this, an insulating film 710 of silicon nitride is formed to a thickness of approx. 50 to 100 nm on the entire surface of the element by the CVD method.

Figure 17:
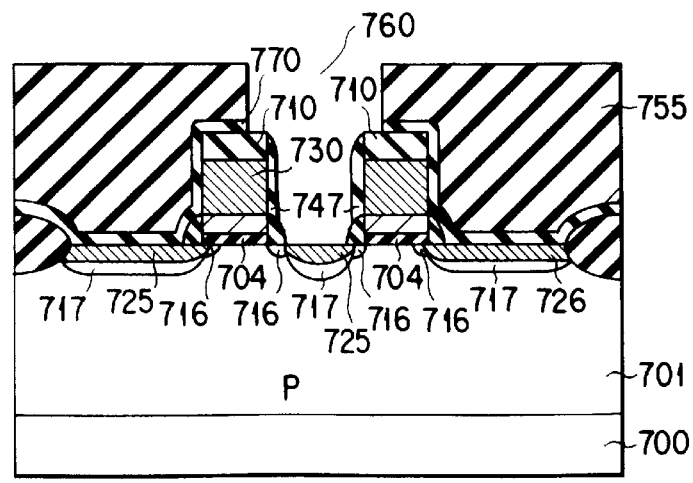
FIG. 17 is a cross sectional view of a semiconductor structure at a step of the manufacturing method of the semiconductor device, according to the sixth embodiment of the present invention.
Figure 18:
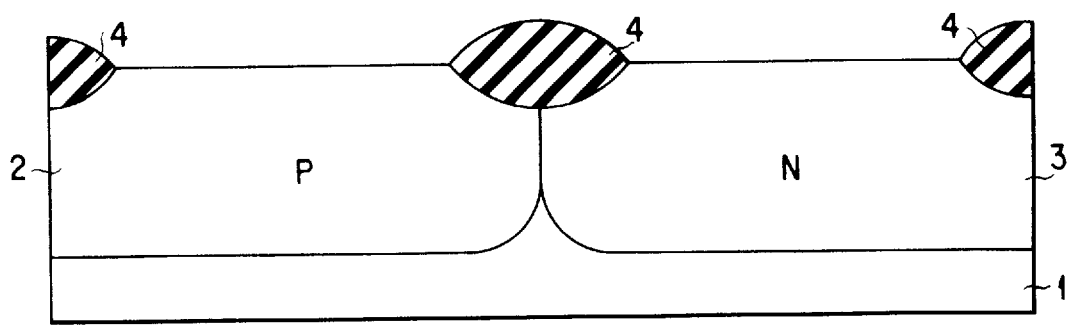
FIG. 18 is a cross sectional view of a semiconductor structure at a step of a manufacturing method of a semiconductor device, according to an example of prior art.
Figure 19:
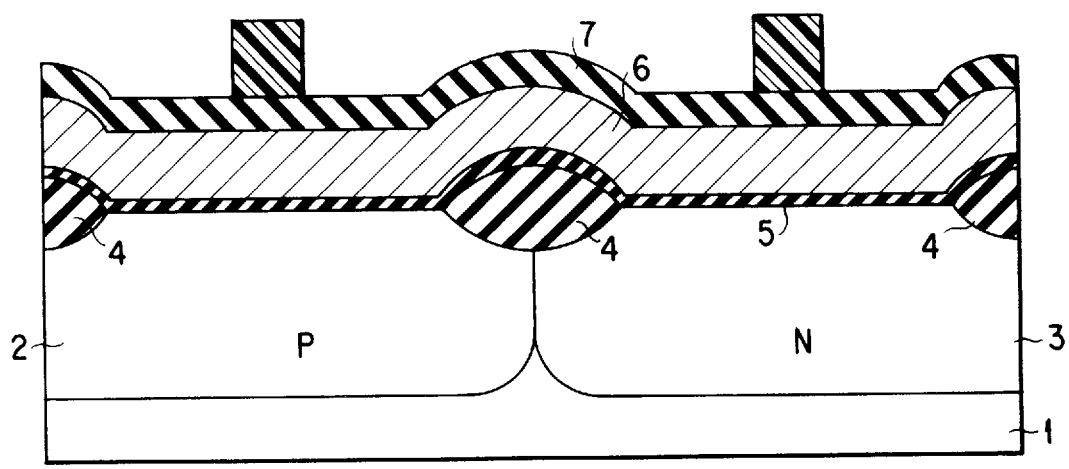
FIG. 19 is a cross sectional view of a semiconductor structure at a step of the manufacturing method of the semiconductor device, according to the example of prior art.
Figure 20:
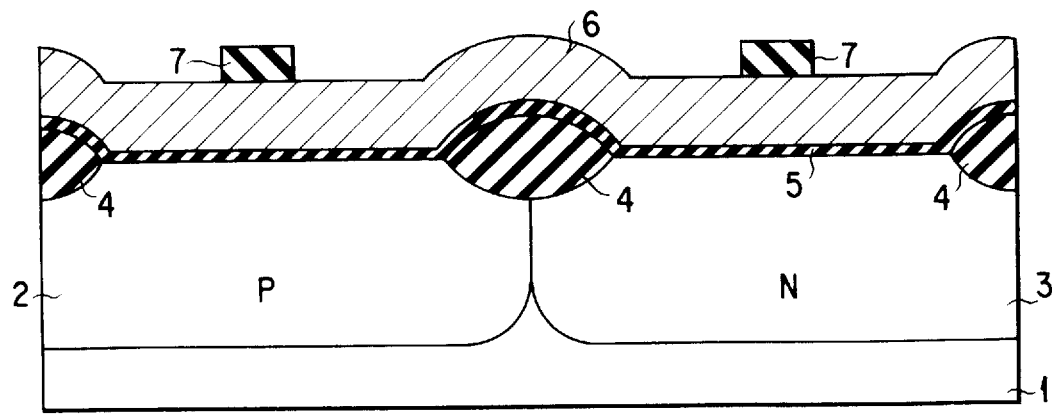
FIG. 20 is a cross sectional view of a semiconductor structure at a step of the manufacturing method of the semiconductor device, according to the example of prior art.
Figure 21:
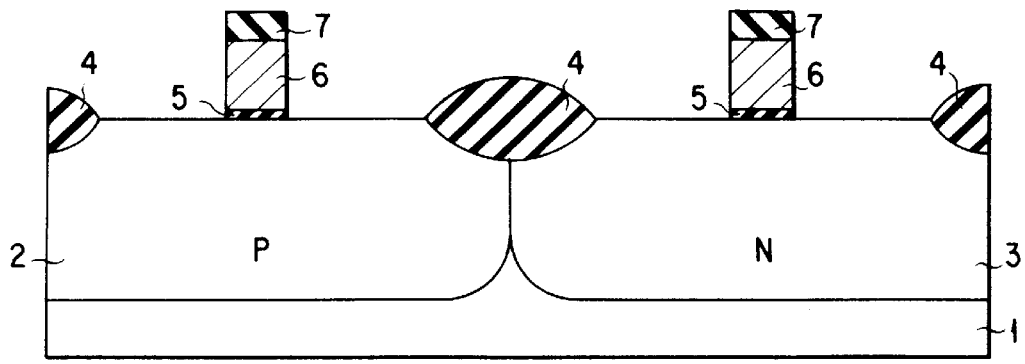
FIG. 21 is a cross sectional view of a semiconductor structure at a step of the manufacturing method of the semiconductor device, according to the example of prior art.
Figure 22:
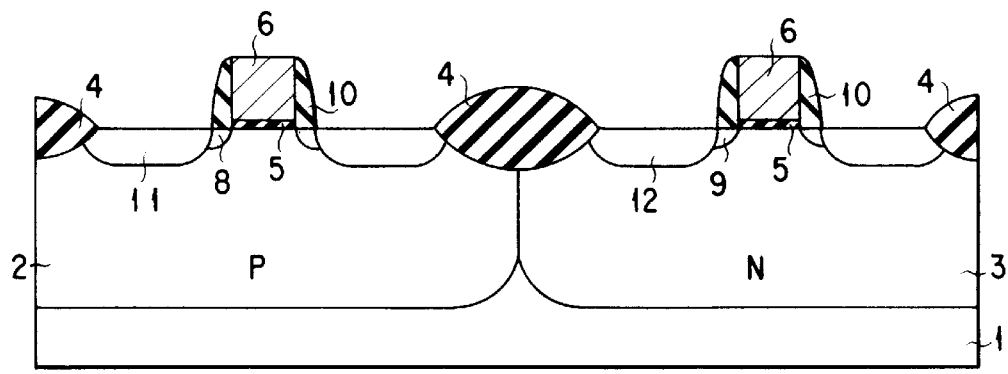
FIG. 22 is a cross sectional view of a semiconductor structure at a step of the manufacturing method of the semiconductor device, according to the example of prior art.
Figure 23:
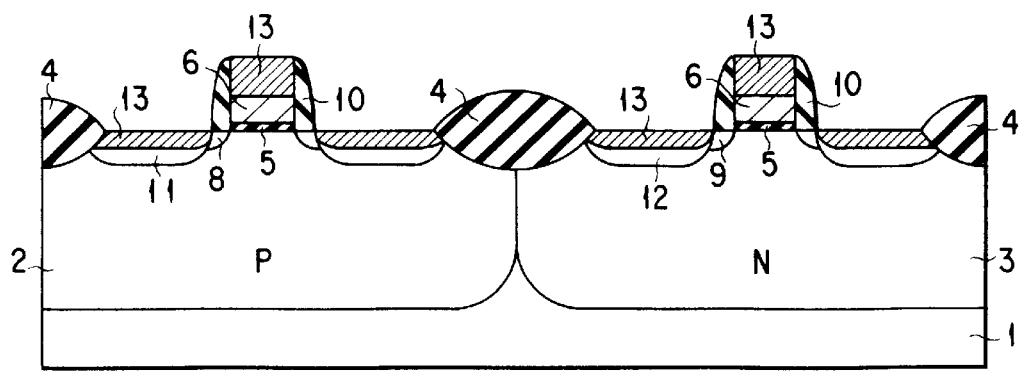
FIG. 23 is a cross sectional view of a semiconductor structure at a step of the manufacturing method of the semiconductor device, according to the example of prior art.
Figure 24:
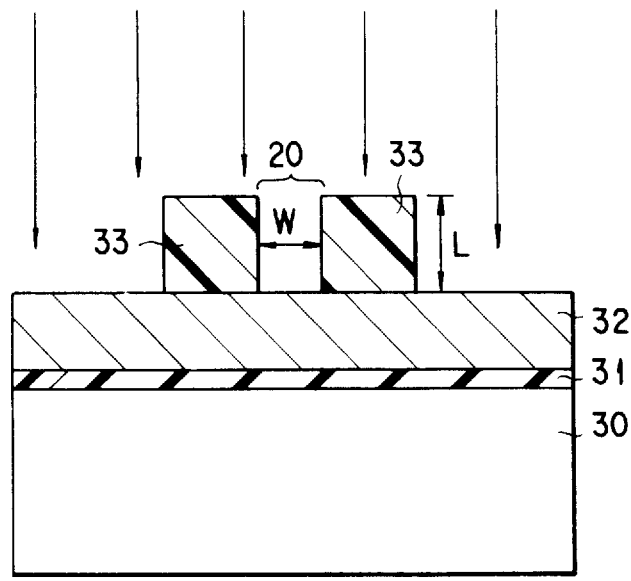
FIG. 24 is a cross sectional view of a semiconductor structure at a step of a manufacturing method of a semiconductor device, according to another example of prior art.
Figure 25:
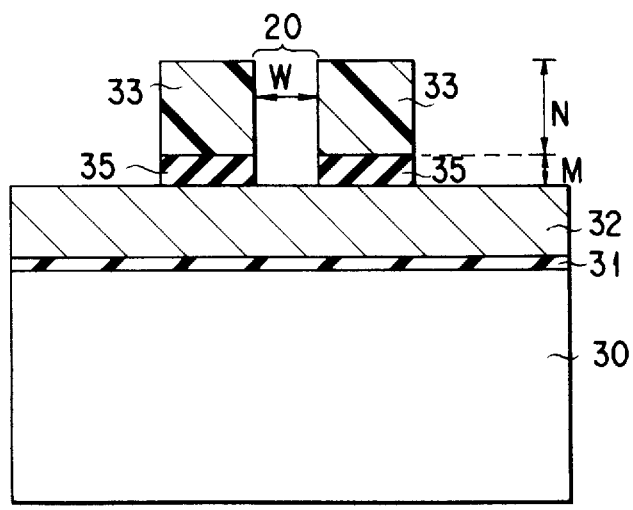
FIG. 25 is a cross sectional view of a semiconductor structure at a step of a manufacturing method of a semiconductor device; according to a further example of a prior art.

Next, as shown in FIG. 17, an interlayered insulating film 755 of silicon dioxide is formed on the entire surface of the element by the CVD method and the interlayered insulating film 755 is selectively etched by the normal photolithography process to form a contact hole 760 for SAC in the interlayered insulating film 755. Then, the insulating film 770 is etched by the anisotropic etching process with the interlayered insulating film 755 used as a mask to form side walls 747 which are higher than the gate electrodes on the inner sides of the two gate electrodes, a wiring material (not shown) is formed in the contact hole 760, and a protection film (not shown) is formed so as to complete a semiconductor device using SAC.

When the side walls 747 which are higher than the gate electrodes are formed on the inner sides of the two gate electrodes, the side walls 747 may be formed by the anisotropic etching process by using the resist which is used in the photolithography process as a mask.

Further, in the step of forming the side walls 747, it is necessary to set the etching ratio for the cap portion 710 and the insulating film 770 to a sufficiently large value as described before, but in a case where the cap portion 710 and the insulating film 770 are formed of the same silicon nitride film, it is necessary to set a large etching ratio by changing the compositions of the cap portion 710 and the insulating film 770 as described before.

Further, in this embodiment, unlike the fourth embodiment, since the silicide reaction proceeds from both side surfaces of the electrode material portion 705, the reaction becomes efficient and the resistance of the gate electrode can be further reduced.

Further, like the fourth embodiment, since the cap portion 710 formed of an insulating film is formed on the gate electrode, the electrode material portion 705 used as the gate electrode can be prevented from being exposed directly to the inside portion of the contact hole 760.

Since this invention is constructed as described above, it is not necessary to remove the cap portion formed on the electrode material portion used as the gate electrode. Therefore, it becomes possible to simultaneously use the SAC which is based on the condition that the cap portion is used and the salicide technique and it becomes unnecessary to effect a step of removing the cap portion, thereby making it possible to simplify the process.

In a case where the silicide reaction is caused to proceed from both side surfaces of the electrode material portion used as the gate electrode, the silicide forming area is larger in this invention than in the conventional case in which the silicide forming process is effected from the upper surface of the electrode material portion used as the gate electrode so that the reaction efficiency can be enhanced in comparison with the conventional case and time for the heat treatment for the silicide reaction can be reduced.

Further, since the silicide forming area can be made larger and refractory metal can be more easily formed on the side surface of the gate electrode by forming the gate electrode into a trapezoidal shape, the silicide reaction can be effected more efficiently.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A method of manufacturing a semiconductor device by use of the salicide technique, comprising the steps of:

forming a first insulating film used as a gate insulating film on a semiconductor substrate of one conductivity type;

forming an electrode material used as a gate electrode on the first insulating film;

forming a second insulating film used as a cap portion on the electrode material;

coating a resist on the second insulating film and then subjecting the resist to the patterning process for formation of the gate electrode by use of the lithography technology;

selectively etching the second insulating film by the anisotropic etching process with the patterned resist used as a mask to transfer the pattern of the resist onto the second insulating film;

removing the resist and then selectively etching the electrode material and the first insulating film by the anisotropic etching process by using the second insulating film on which the pattern is transferred as a mask to form the gate electrode;

doping impurity of opposite conductivity type into the semiconductor substrate of one conductivity type by using the second insulating film which lies on the gate electrode as a mask to form first diffusion layers used as a source and drain;

forming a third insulating film on the upper surface of the semiconductor substrate of one conductivity type, the side surface of the gate electrode and the upper surface of the second insulating film;

forming side walls lower than the gate electrode on both side surfaces of the gate electrode by selectively etching the third insulating film by the anisotropic etching process until the side surface of the gate electrode is exposed;

doping impurity of opposite conductivity type into the electrode material via the second insulating film without using a mask and doping impurity into the semiconductor substrate of one conductivity type to form a second diffusion layer in a self-aligned manner;

forming a refractory metal film on at least the upper surface of the semiconductor substrate of one conductivity type and the exposed side surface of the gate electrode and effecting the heat treatment to convert the surface portion of the semiconductor substrate of one conductivity type into silicide, and at the same time, converting the electrode material into silicide from the exposed portion of the both side surfaces of the gate electrode; and removing an unreacted refractory metal portion of the refractory metal film.

2. The manufacturing method according to claim 1, wherein said step of converting the electrode material and the semiconductor substrate of one conductivity type into silicide includes a step of converting the electrode material into silicide only from an exposed portion of one side surface of the gate electrode.

3. The manufacturing method according to claim 1, wherein the gate electrode is etched and formed into a trapezoidal form when the gate electrode is formed by the anisotropic etching process.

4. The manufacturing method according to claim 1, wherein the height of the side wall lower than the gate electrode is not less than 300 nm and the width thereof is not less than 50 nm.

5. A method of manufacturing a semiconductor device having self-aligned contacts, comprising the steps of:

forming a first insulating film used as a gate insulating film on a semiconductor substrate of one conductivity type;

forming an electrode material used as a gate electrode on the first insulating film;

forming a second insulating film used as a cap portion on the electrode material;

coating a resist on the second insulating film and then subjecting the resist to the patterning process for formation of the gate electrode by use of the lithography technology;

selectively etching the second insulating film by the anisotropic etching process with the patterned resist used as a mask to transfer the pattern of the resist formed for formation of the gate electrode onto the second insulating film;

removing the resist and then selectively etching and removing the electrode material and the first insulating film by the anisotropic etching process with the second insulating film used as a mask to form two gate electrodes on which the second insulating film lies;

doping impurity of opposite conductivity type into the semiconductor substrate of one conductivity type by using the second insulating film which lies on the two gate electrodes as a mask to form first diffusion layers used as a source and drain;

forming a third insulating film on the surface of the semiconductor substrate of one conductivity type, the side surfaces of the two gate electrodes and the upper surface of the second insulating film;

coating a resist on the third insulating film until the third insulating film formed on the two gate electrodes is buried and then leaving the resist only part of the upper portions of the two gate electrodes and a portion between the two gate electrodes by use of the lithography technology;

etching the third insulating film by the anisotropic etching process with the resist used as a mask to form first side walls formed of the third insulating film only on outer side portions of the two gate electrodes;

removing the resist, etching the first side walls by the anisotropic etching process without using a mask to make the first side wall lower than the gate electrode and expose part of the side surfaces of the outside portions of the two gate electrodes, and at the same time, forming second side walls higher than the gate electrode on the inner sides of the two gate electrodes by etching the third insulating film formed between the two gate electrodes to form the side walls with different heights on the outer sides and inner sides of the two gate electrodes;

forming second diffusion layers used as a source and drain by doping impurity of opposite conductivity type into the semiconductor substrate of one conductivity type by using the side walls formed on the outer and inner sides of the two gate electrodes as a mask; and forming a refractory metal film on at least the surface of the semiconductor substrate of one conductivity type and the exposed portion of the electrode material on the outer side surfaces of the two gate electrodes and effecting the heat treatment to convert the surface portion of the semiconductor substrate of one conductivity type into silicide, and at the same time, converting the electrode material into silicide from the exposed portion of the electrode material on the outer side surfaces of the two gate electrodes.

6. The manufacturing method according to claim 5, wherein not only the third insulating film but also part of the second insulating film which lies outside the gate electrode is etched when the anisotropic etching process is effected in said step of forming the first side walls.

7. A method of manufacturing a semiconductor device having self-aligned contacts, comprising the steps of:

forming a first insulating film used as a gate insulating film on a semiconductor substrate of one conductivity type;

forming an electrode material used as a gate electrode on the first insulating film;

forming a second insulating film used as a cap portion on the electrode material;

coating a resist on the second insulating film and then subjecting the resist to the patterning process for formation of the gate electrode by use of the lithography technology;

selectively etching the second insulating film by the anisotropic etching process with the patterned resist used as a mask to transfer the pattern of the resist formed for formation of the gate electrode onto the second insulating film;

removing the resist and then selectively etching and removing the electrode material and the first insulating film by the anisotropic etching process with the second insulating film used as a mask to form two gate electrodes on which the second insulating film lies;

doping impurity of opposite conductivity type into the semiconductor substrate of one conductivity type by using the second insulating film which lies on the two gate electrodes as a mask to form first diffusion layers used as a source and drain;

forming a third insulating film on the surface of the semiconductor substrate of one conductivity type, the side surfaces of the two gate electrodes and the upper surface of the second insulating film;

etching the third insulating film by the anisotropic etching process without using a mask to form first side walls lower than the gate electrode on both side surfaces of the two gate electrodes;

doping impurity of opposite conductivity type into the electrode material via the second insulating film by using the first side walls formed on the inner and outer sides of the two gate electrodes as a mask, and at the same time, doping impurity of opposite conductivity type into the semiconductor substrate of one conductivity type to form second diffusion layers used as a source and drain in a self-alignment manner;

forming a refractory metal film on at least the surface of the semiconductor substrate of one conductivity type and the exposed portion of the electrode material on the both side surfaces of the two gate electrodes and effecting the heat treatment to convert the surface portion of the semiconductor substrate of one conductivity type into silicide, and at the same time, converting the electrode material into silicide from the exposed portion of the electrode material on the both side surfaces of the two gate electrodes;

removing an unreacted portion of the refractory metal film and forming a fourth insulating film on the upper surface of the semiconductor substrate of one conductivity type, the side surfaces of the gate electrodes and the first side walls, and the upper surface of the second insulating film;

forming a fifth insulating film on the fourth insulating film until the two gate electrodes are completely buried;

coating a resist on the fifth insulating film and removing part of the resist formed on the two gate electrodes and formed between the two gate electrodes by use of the lithography technology;

etching and removing the fifth insulating film by the anisotropic etching process with the remaining resist used as a mask; and etching the fourth insulating film by the anisotropic etching process with the resist used as a mask to form second side walls higher than the gate electrode on the inner sides of the two gate electrodes.

8. The manufacturing method according to claim 7, wherein the resist removed by the lithography technology in said step of removing the resist coated until the fourth insulating film on the second insulating film is buried is only a resist lying between the two gate electrodes.

9. The manufacturing method according to claim 5, wherein the height of the first side wall is not less than 300 nm and the width thereof is not less than 50 nm.

10. The manufacturing method according to claim 5, wherein the gate electrode formed in said step of forming the two gate electrodes on which the second insulating film lies is formed in a trapezoidal shape.

11. The manufacturing method according to claim 7, wherein the resist is removed and the fifth insulating film is used as a mask when the second side walls are formed by the anisotropic etching process in said step of forming the side walls higher than the gate electrode on the inner sides of the two gate electrodes.

12. The manufacturing method according to claim 7, wherein the height of the first side wall is not less than 300 nm and the width thereof is not less than 50 nm.

13. The manufacturing method according to claim 7, wherein the gate electrode formed in said step of forming the two gate electrodes on which the second insulating film lies is formed in a trapezoidal shape.

* * * * *